(12) United States Patent
Marui et al.

(10) Patent No.: US 12,068,411 B2
(45) Date of Patent: Aug. 20, 2024

(54) SEMICONDUCTOR DEVICE AND METHOD FOR MANUFACTURING SAME

(71) Applicants: NISSAN MOTOR CO., LTD., Yokohama (JP); RENAULT S.A.S., Boulogne-Billancourt (FR)

(72) Inventors: Toshiharu Marui, Kanagawa (JP); Tetsuya Hayashi, Kanagawa (JP); Keiichiro Numakura, Kanagawa (JP); Wei Ni, Kanagawa (JP); Ryota Tanaka, Kanagawa (JP); Keisuke Takemoto, Kanagawa (JP)

(73) Assignees: NISSAN MOTOR CO., LTD., Yokohama (JP); RENAULT S. A. S., Boulogne-Billancourt (FR)

( * ) Notice: Subject to any disclaimer, the term of this patent is extended or adjusted under 35 U.S.C. 154(b) by 0 days.

(21) Appl. No.: 17/040,631

(22) PCT Filed: Mar. 26, 2018

(86) PCT No.: PCT/IB2018/000548
§ 371 (c)(1),
(2) Date: Sep. 23, 2020

(87) PCT Pub. No.: WO2019/186224
PCT Pub. Date: Oct. 3, 2019

(65) Prior Publication Data
US 2021/0367070 A1   Nov. 25, 2021

(51) Int. Cl.
*H01L 29/78* (2006.01)
*H01L 29/06* (2006.01)
(Continued)

(52) U.S. Cl.
CPC ...... *H01L 29/7813* (2013.01); *H01L 29/0634* (2013.01); *H01L 29/41766* (2013.01);
(Continued)

(58) Field of Classification Search
CPC ..... H01L 29/063–0634; H01L 29/7813; H01L 29/7825; H01L 29/66613–66628;
(Continued)

(56) References Cited

U.S. PATENT DOCUMENTS

| 5,701,026 A | 12/1997 | Fujishima et al. |
| 5,885,878 A * | 3/1999 | Fujishima ........... H01L 29/7816 257/E21.418 |
| 6,072,215 A * | 6/2000 | Kawaji ............... H01L 29/4236 257/334 |

(Continued)

FOREIGN PATENT DOCUMENTS

| EP | 3 024 018 A1 | 5/2016 | |
| JP | H08181313 | * 10/1994 | |
| JP | 8-181313 A | 7/1996 | |
| JP | 2001274398 A | * 10/2001 | ....... H01L 29/66348 |

*Primary Examiner* — Younes Boulghassoul
*Assistant Examiner* — Quinton A Brasfield
(74) *Attorney, Agent, or Firm* — Foley & Lardner LLP

(57) ABSTRACT

A semiconductor device includes: a substrate having a groove formed on a main surface; a drift region of a first conductivity type, the drift region having a portion disposed at a bottom part; a well region of a second conductivity type, the well region being disposed in one sidewall to be connected to the drift region; a first semiconductor region of the first conductivity type, the first semiconductor region being disposed on a surface of the well region in the sidewall to be away from the drift region; a second semiconductor region of the first conductivity type, the second semiconductor region being disposed to be opposed to the well region via the drift region; and a gate electrode opposed to the well region, the gate electrode being disposed in a gate trench that has an opening extending over the upper surfaces of the well region and the first semiconductor region.

10 Claims, 11 Drawing Sheets

(51) Int. Cl.
    *H01L 29/417*     (2006.01)
    *H01L 29/66*     (2006.01)

(52) U.S. Cl.
    CPC .... *H01L 29/66712* (2013.01); *H01L 29/7825* (2013.01); *H01L 29/0653* (2013.01); *H01L 29/66704* (2013.01)

(58) Field of Classification Search
    CPC ......... H01L 29/66704; H01L 29/42336; H01L 29/42352; H01L 29/42356; H01L 29/4236; H01L 21/823418; H01L 21/823814; H01L 21/823425; H01L 29/0847; H01L 29/7848; H01L 29/66636; H01L 29/41783; H01L 29/66575; H01L 29/161; H01L 29/167; H01L 29/41766; H01L 29/4175; H01L 29/41758; H01L 29/41775; H01L 29/7835; H01L 29/7809; H01L 29/7816; H01L 21/823493; H01L 29/407; H01L 29/0653; H01L 29/1066; H01L 29/66893; H01L 29/1058; H01L 29/8086; H01L 2924/13062; H01L 27/098
See application file for complete search history.

(56) References Cited

U.S. PATENT DOCUMENTS

| | | | | |
|---|---|---|---|---|
| 2002/0155685 | A1* | 10/2002 | Sakakibara | H01L 29/7825 257/E29.264 |
| 2004/0217377 | A1* | 11/2004 | Deboy | H01L 29/8611 257/E29.259 |
| 2009/0095999 | A1* | 4/2009 | Jang | H01L 29/66734 257/E21.396 |
| 2009/0166728 | A1* | 7/2009 | Pan | H01L 29/0623 438/270 |
| 2011/0210391 | A1* | 9/2011 | Kitagawa | H01L 29/7825 257/331 |
| 2012/0241848 | A1* | 9/2012 | Uchihara | H01L 29/66734 438/270 |
| 2013/0248998 | A1* | 9/2013 | Misu | H01L 29/7801 257/335 |
| 2014/0197479 | A1* | 7/2014 | Um | H01L 29/7803 438/270 |
| 2016/0181357 | A1 | 6/2016 | Yoshida et al. | |
| 2016/0181371 | A1 | 6/2016 | Ni et al. | |
| 2016/0293693 | A1* | 10/2016 | Niimura | H01L 29/7813 |
| 2019/0081624 | A1* | 3/2019 | Zhang | H01L 29/7811 |

* cited by examiner

SEMICONDUCTOR DEVICE AND METHOD FOR MANUFACTURING SAME

TECHNICAL FIELD

The present invention relates to semiconductor devices and methods for manufacturing the same.

BACKGROUND ART

Technological development is in progress for improving the performance of semiconductor devices. For example, a semiconductor device is disclosed in which in order to improve the trade-off characteristic between breakdown voltage and on-resistance by decreasing the dimensions of the unit cell, a drain region is formed at the bottom part of a trench formed at a part of the surface layer of a semiconductor substrate, and a sidewall of the trench is a drift region (see Patent Literature 1). This semiconductor device has a drain electrode on a conducting material filling the inside of the trench. Then, a base region and a source region are formed in part of the surface layer of the semiconductor substrate where the trench is not formed, and the drain region and the source region are disposed on the respective sides of the gate electrode.

CITATION LIST

Patent Literature

Patent Literature 1: Japanese Patent Application Publication No. H08-181313

SUMMARY OF INVENTION

Technical Problem

Unfortunately, in the structure in which the source region and the drain region are disposed on the respective sides of the gate electrode, the region immediately below the source region does not contribute to the operation of the transistor. This raises a problem that the chip area of the transistor is not used effectively, requiring an extra area accordingly.

The present invention has been made in light of the above problem, and an object thereof is to provide a semiconductor device and method of manufacturing the same that make it possible to reduce the chip area of a transistor.

Solution to Problem

A summary of a semiconductor device according to an aspect of the present invention is that the semiconductor device includes: a drift region disposed at the bottom part of a groove formed on a substrate; a well region and source region layered along a sidewall of the groove; and a drain region disposed in the groove, and a gate electrode is disposed in a gate trench that has an opening extending over the upper surfaces of the well region and the source region and extends in the depth direction of the groove.

A summary of a method of manufacturing a semiconductor device according to another aspect of the present invention is that the method includes the steps of: forming a drift region at the bottom part of a groove formed in a substrate; forming a well region and source region layered along a sidewall of the groove; and forming a drain region in the groove, and a gate electrode is formed in a gate trench that has an opening extending over the upper surfaces of the well region and the source region and extends in the depth direction of the groove.

Advantageous Effects of Invention

The present invention provides a semiconductor device and method of manufacturing the same that make it possible to reduce the chip area of a transistor.

DESCRIPTION OF EMBODIMENTS

Figure 1:
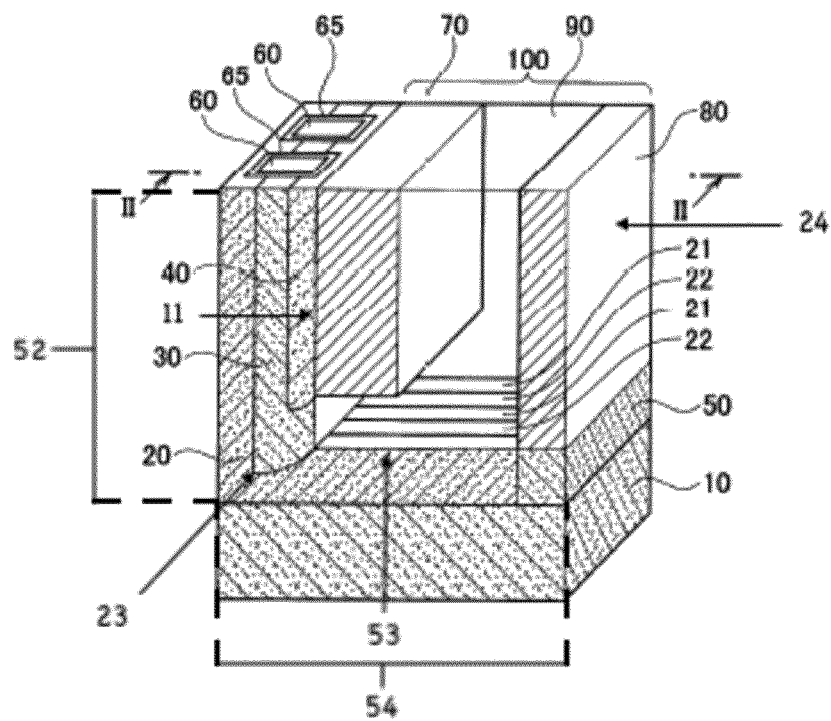
FIG. 1 is a schematic perspective diagram illustrating the configuration of a semiconductor device according to a first embodiment of the present invention.

Hereinafter, embodiments will be described with reference to the drawings. The same portions in the illustration of the drawings are denoted by the same reference signs, and description thereof is omitted. Here, the drawings are schematically illustrated, and thus, the relationship between the thickness and the plane dimension, the ratio of the thicknesses of layers, and the like may be different from actual ones in the drawings. Also, there may be differences in the relationship or the ratio of dimensions between the drawings.

First Embodiment

A semiconductor device according to a first embodiment of the present invention includes, as illustrated in FIG. 1, a substrate 10 having a groove 100 formed on its main surface, and a drift region 20, well region 30, first semiconductor region 40, and second semiconductor region 50 formed on the substrate 10.

The drift region 20 is of a first conductivity type and has a portion disposed at a bottom part 53 of the groove 100. Note that in the embodiment illustrated in FIG. 1, the drift region 20 is disposed to continue from one sidewall 11 of the groove 100 (hereinafter referred to as the "first sidewall 11") to the bottom part 53 of the groove 100.

The well region 30 which is of a second conductivity type is disposed along the first sidewall 11 of the groove 100 to be connected to the drift region 20. The well region 30 illustrated in FIG. 1 is disposed on the surface of the drift region 20 along the first sidewall 11 of the groove 100, and the lower end 23 of the well region 30 is connected to the drift region 20 at the bottom part 53 of the groove 100.

The first semiconductor region 40 which is of the first conductivity type is disposed on the surface of the well region 30 along the first sidewall 11 of the groove 100. The first semiconductor region 40 is disposed on the surface of the well region 30 not to extend over the outer edge of the well region 30 so that the first semiconductor region 40 is isolated from the drift region 20. Accordingly, as illustrated in FIG. 1, the lower end of the first semiconductor region 40 is positioned above the lower end of the well region 30.

Figure 2:
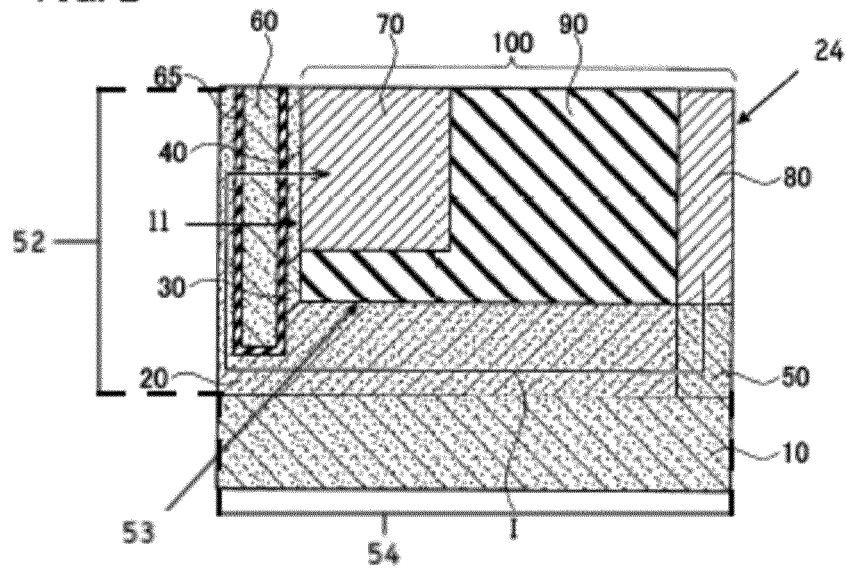
FIG. 2 is a cross-sectional diagram viewed along II-II direction in FIG. 1, illustrating the current route of the main electrical current of the semiconductor device according to the first embodiment of the present invention.

The second semiconductor region 50 which is of the first conductivity type is disposed in the groove 100 to be opposed to the well region 30 via the drift region 20. The second semiconductor region 50 is connected to the drift region 20 at a position away from the well region 30. The second semiconductor region 50 illustrated in FIG. 2 is disposed at the bottom part 53 of the groove 100 to adjoin to the drift region 20 to be close to the sidewall 24 of the groove 100 opposed to the first sidewall 11 (hereinafter referred to as the "second sidewall 24").

Note that the first conductivity type and the second conductivity type are conductivity types opposite to each other. Specifically, if the first conductivity type is n-type, then the second conductivity type is p-type. If the first conductivity type is p-type, then the second conductivity type is n-type. In the following, description is made as an example for the case where the first conductivity type is n-type and the second conductivity type is p-type.

As described above, the semiconductor device illustrated in FIG. 1 has, along the first sidewall 11 of the groove 100, the drift region 20, the well region 30, and the first semiconductor region 40, and those are layered along the direction of the normal line to the first sidewall 11 (hereinafter referred to as the "lateral direction" of the groove 100). Then, openings are formed to extend over the upper surfaces of the drift region 20, the well region 30, and the first semiconductor region 40, and from the openings, multiple gate trenches are formed to extend in the depth direction of the groove 100. The gate trenches have a gate insulating film 65 disposed on their inner wall surfaces. The gate trenches are formed to reach the drift region 20 disposed at the bottom part 53 of the groove 100.

As illustrated in FIG. 1, the gate insulating film 65 is formed continuously over the drift region 20, the well region 30, and the first semiconductor region 40 in the lateral direction. Inside the gate trench, a gate electrode 60 is disposed to be opposed to the well region 30 via the gate insulating film 65.

The semiconductor device illustrated in FIG. 1 also includes a first main electrode 70 electrically connected to the first semiconductor region 40 and a second main electrode 80 electrically connected to the second semiconductor region 50. The first main electrode 70 is disposed on the surface of the first semiconductor region 40 along the first sidewall 11 of the groove 100. The second main electrode 80 is disposed along the second sidewall 24 of the groove 100 to be opposed to the first main electrode 70, and the lower end of the second main electrode 80 is in contact with the second semiconductor region 50 at the bottom part of the groove 100.

The first main electrode 70 is one end of the current route of the main electrical current that flows through the semiconductor device in the on state. The second main electrode 80 is the other end of the current route. The main electrical current of the semiconductor device flows between the first main electrode 70 and the second main electrode 80 via the first semiconductor region 40, the well region 30, the drift region 20, and the second semiconductor region 50.

As described later in detail, the semiconductor device illustrated in FIG. 1 works as a transistor, and the main electrical current is controlled by applying a specified voltage to the gate electrodes 60 disposed in a middle of the current route. In the following, the semiconductor device is described based on the assumption that the first semiconductor region 40 is the source region, the first main electrode 70 is the source electrode, the second semiconductor region 50 is the drain region, and the second main electrode 80 is the drain electrode.

The groove 100 is filled with an isolation insulating film 90. Specifically, the isolation insulating film 90 is disposed above the drift region 20 disposed at the bottom part of the groove 100 and between the source electrode 70 and the drain electrode 80. This isolation insulating film 90 insulates and isolates the drift region 20 and the source electrode 70 disposed above the drift region 20 from each other. FIG. 1 illustrates the semiconductor device as if the isolation insulating film 90 were transparent to make it easy to understand the structure of the semiconductor device. In other words, only the outer edges are depicted for the isolation insulating film 90 (the same is true of other perspective diagrams).

Note that the regions outside the groove 100, in other words, the regions outside the sidewall portion of the drift region 20 and outside the drain electrode 80, the illustration of which are omitted, are regions of the substrate 10 where the groove 100 is not formed.

The portion of the drift region 20 disposed at the bottom part of the groove 100, illustrated in FIG. 1, has a structure in which an n-type drift region 21, which is a first conductivity type region, and a p-type drift region 22, which is a second conductivity type region, are disposed alternately in parallel with the main surface of the substrate 10 and along the direction in which the groove 100 extends. In other words, the semiconductor device illustrated in FIG. 1 has a super junction structure (SJ structure) in which multiple pn junctions are arranged at a constant cycle along the direction in which the groove 100 extends (hereinafter referred to as the "longitudinal direction" of the groove 100). In semiconductor devices with the SJ structure, the main electrical current flows through the n-type drift regions 21 in which the concentration of n-type impurities is high in the drift region 20, and this reduces the on-resistance. On the other hand, when a reverse bias is applied, the n-type drift regions 21 and the p-type drift regions 22 are depleted by depletion layers spreading from pn junctions, keeping high breakdown voltage.

In the semiconductor device illustrated in FIG. 1, channel regions are formed in the on state in the well region 30 which is in contact with the gate insulating films 65. Hereinafter, the basic operation of the semiconductor device illustrated in FIG. 1 will be described.

In the on operation, the semiconductor device functions as a transistor by the potential of the gate electrodes 60 being controlled with respect to the potential of the source electrode 70 in the state where a positive voltage is applied to the drain electrode 80. Specifically, when the voltage between the gate electrodes 60 and the source electrode 70 is a specified threshold voltage or higher, the inversion layers are formed in the channel regions in the well region 30 on the side surfaces of the gate electrodes 60. This makes the semiconductor device in the on state, and the main electrical current flows between the drain electrode 80 and the source electrode 70. At this time, the main electrical current flows in the well region 30 along the direction in parallel with the main surface of the substrate 10. In FIG. 2, the arrow I indicates the current route of the main electrical current of the semiconductor device in the on state.

For the off operation, the voltage between the gate electrodes 60 and the source electrode 70 is set to a specified threshold voltage or lower. This makes the inversion layers disappear, cutting off the main electrical current.

Figure 3:
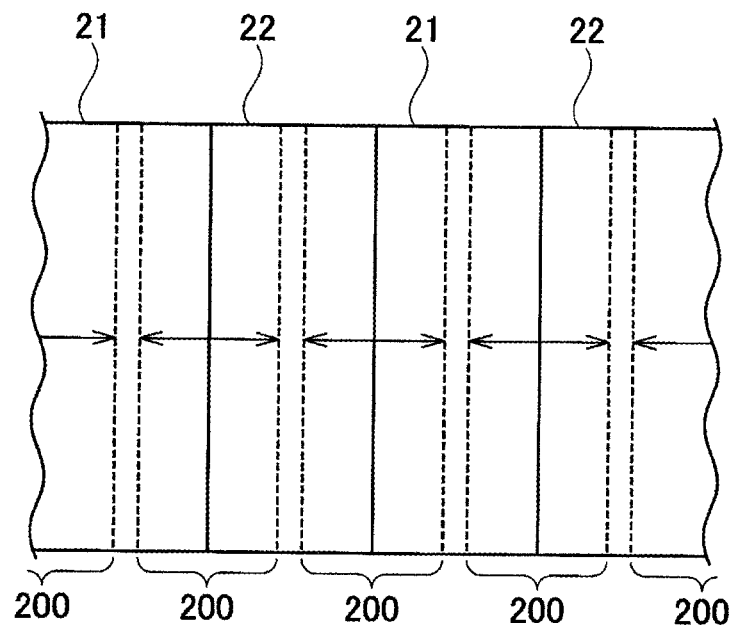
FIG. 3 is a schematic diagram for explaining the spread of depletion layers of the semiconductor device according to the first embodiment of the present invention.

In the off state, depletion layers spread from the pn junction between the well region 30 and the drift region 20 toward the drain region 50. At this time, as indicated by the arrows in FIG. 3, depletion layers 200 spread from the interfaces between the n-type drift regions 21 and the p-type drift regions 22. When the reverse voltage increases to a certain level, both the n-type drift regions 21 and the p-type drift regions 22 are completely depleted (which is called the pinch-off state).

When the n-type drift regions 21 and the p-type drift regions 22 are in the pinch-off state, the electric field distribution of the n-type drift region 21 and the p-type drift region 22 becomes a uniform rectangle distribution, which greatly decreases the maximum electric field exerted on the semiconductor device. This improves the breakdown voltage of the semiconductor device.

In the semiconductor device illustrated in FIG. 1 the source region 40 and the source electrode 70 are disposed above the drift region 20 disposed at the bottom part of the groove 100. Thus, unlike the structure having a source electrode and a drain electrode disposed on the respective sides of a gate electrode, the region immediately below the source electrode 70 is an active region, which is not a region that does not contributes to the operation of the transistor. Hence, in the semiconductor device illustrated in FIG. 1, a region that does not contribute to the operation of the transistor is reduced, which makes it possible to reduce the chip area.

In addition, the source region 40 and the well region 30 are disposed along the first sidewall 11 of the groove 100, and the gate trenches are formed to extend in the depth direction of the groove 100. Hence, in the on state, the end portion of the channel region extends in the depth direction along the first sidewall 11 of the groove 100. In other words, the channel region is formed to have a gate width of from the opening of the groove 100 to the bottom part of the groove 100. The wide channel region formed as described above reduces the on-resistance.

Further, the source region 40 is formed in the groove 100 along the first sidewall H, and the source region 40 extends in the depth direction of the groove 100. This allows the contact portion between the source region 40 and the source electrode 70 formed along the first sidewall 11 of the groove 100 to extend in the depth direction of the groove 100. This configuration makes it possible to increase the contact area without increasing the chip area, compared to the case of forming the contact portion between the source region 40 and the source electrode 70 to be in parallel with the main surface of the substrate 10. Thus, the contact resistance between the source region 40 and the source electrode 70 is reduced, which in turn reduces the on-resistance.

Figure 4:
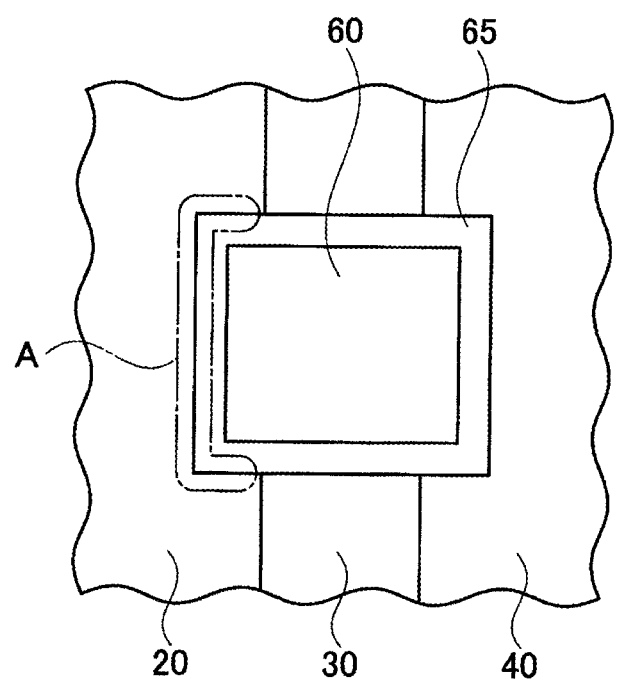
FIG. 4 is a schematic plan view of a gate trench of the semiconductor device according to the first embodiment of the present invention.

The semiconductor device illustrated in FIG. 1 has a structure in which part of the drift region 20 is disposed along the first sidewall 11 of the groove 100. Thus, when the well region 30 opposed to the gate insulating films 65 induces channel charge, and the semiconductor device is turned to the on state, accumulated charge is generated at the boundary between the drift region 20 and the gate insulating film 65 in the region surrounded by the dashed line A in FIG. 4. The current route caused by this accumulated charge is formed in parallel with the channel regions formed in the well region 30, providing the effect of reducing resistance components in the channel regions of the semiconductor device.

Note that it is preferable that the substrate 10 be an insulating substrate. Use of an insulating substrate simplifies the element separation process for the case where multiple semiconductor devices are integrated on one substrate 10. In the case where the semiconductor device is mounted on a cooling unit, an insulating substrate is not necessary between the substrate 10 and the cooling unit. Here, a substrate "having an insulating property" means that the resistivity of the substrate is several kΩ/cm or more.

For example, silicon carbide (SiC) having an insulating property is used for the substrate 10. There are several polytypes (crystal polymorphs) of SiC, and a typical 4H—SiC substrate can be used for the substrate 10.

Use of a SiC substrate for the substrate 10 provides a higher insulating property and a higher thermal conductivity of the substrate 10. This allows the semiconductor device to be cooled efficiently by attaching the back surface of the substrate 10 directly to a cooling mechanism. Since this structure provides a larger thermal conductivity in the SiC substrate, heat generation caused by the main electrical current when the semiconductor device is in the on state can be dissipated efficiency. SiC is a wide band gap semiconductor, in which the number of intrinsic carriers is small, and hence, it is easy to achieve a higher insulating property, and use of SiC makes it possible to achieve a semiconductor device with a high breakdown voltage.

Hereinafter, a method of manufacturing a semiconductor device according to the first embodiment of the present invention will be described with reference to the drawings. Note that the method of manufacturing a semiconductor device described below is an example, and thus, in addition to this method, various manufacturing methods including variations of this method are feasible.

First, a groove 100 is formed on the main surface of a substrate 10 which is non-doped silicon carbide insulating semiconductor. The depth of the groove 100 is, for example, approximately 10 to 20 μm, and the width in in the lateral direction is, for example, approximately 10 μm.

Figure 5:
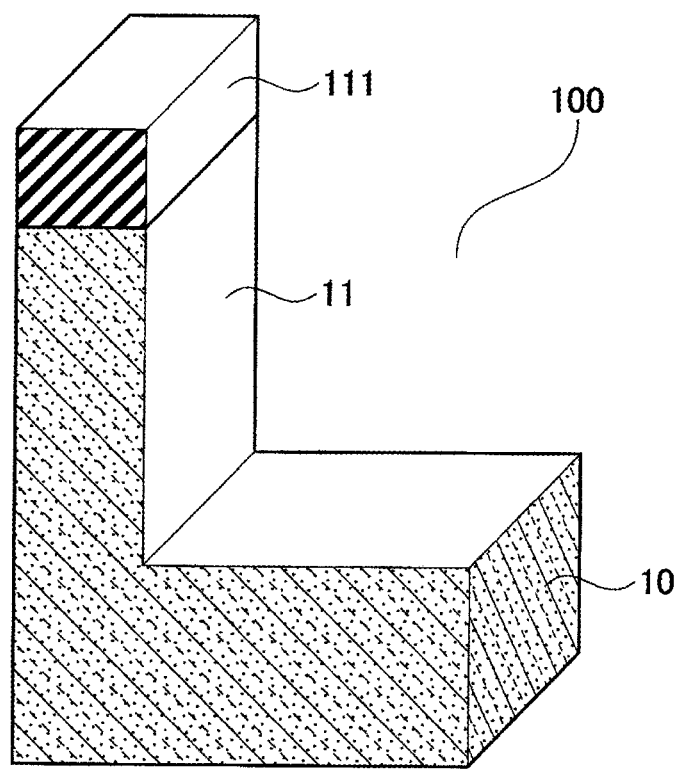
FIG. 5 is a perspective diagram for explaining a method of manufacturing the semiconductor device according to the first embodiment of the present invention (part 1).

To form the groove 100 by an etching method, a mask material 111 is formed in a specified shape on the main surface of the substrate 10 (see FIG. 5). The mask material 111 may be, for example, a silicon oxide film, and the deposition method may be a thermal CVD method or a plasma CVD method. Then, a photoresist material on the mask material 111 is patterned (not illustrated). For the patterning method, a general photolithography technique is used. The patterned photoresist material is used as a mask to etch the mask material 111. For the etching method, a wet etching method using hydrofluoric acid or a dry etching method such as reactive ion etching is used. Next, the photoresist material is removed using oxygen plasma, sulfuric acid, or the like. The mask material 111 formed as described above is used as an etching mask to selectively etch substrate 10 by a dry etching method. Thus, the groove 100 is formed as illustrated in FIG. 5.

Figure 6:
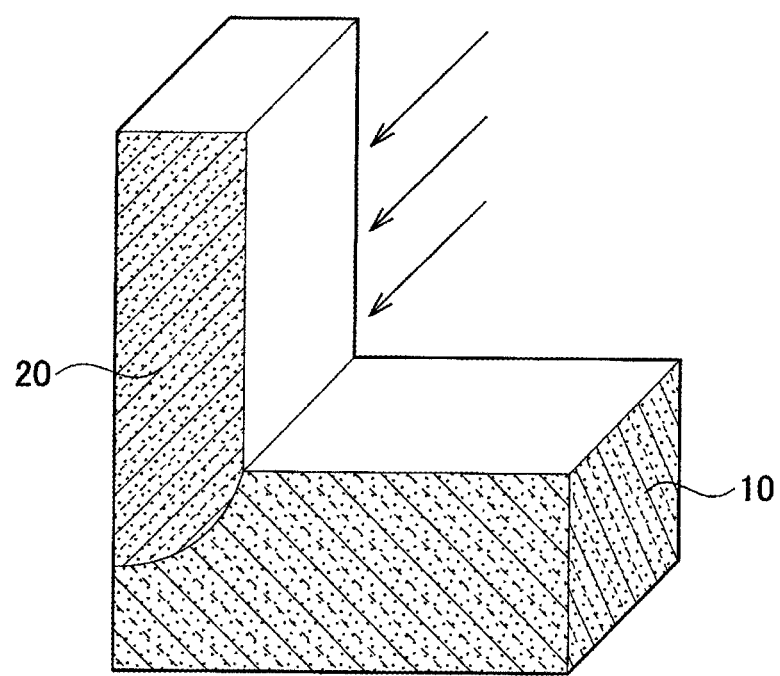
FIG. 6 is a perspective diagram for explaining the method of manufacturing the semiconductor device according to the first embodiment of the present invention (part 2).

After the mask material 111 is removed, a portion of the drift region 20 that is along the first sidewall 11 of the groove 100 (hereinafter referred to as a "sidewall portion 52" of the drift region 20 with reference to FIGS. 1 and 2) is formed by ion implantation or the like. For example, as the arrows indicate in FIG. 6, the sidewall portion 52 of the drift region 20 is formed by ion-implanting impurities of a first conductivity type obliquely from above the opening of the groove 100 into the first sidewall 11. At this time, the impurities can be implanted only into the first sidewall 11 of the groove 100 by setting the angle at which the impurities are implanted into the first sidewall 11 of the groove 100, according to the aspect ratio determined from the depth and the width in in the lateral direction of the groove 100. Through this process, the sidewall portion 52 of the drift region 20 is formed along the first sidewall 11 of the groove 100. Since the impurities are implanted from obliquely above, the lower end of the sidewall portion 52 of the drift region 20 reaches below the bottom part 53 of the groove 100.

Figure 7:
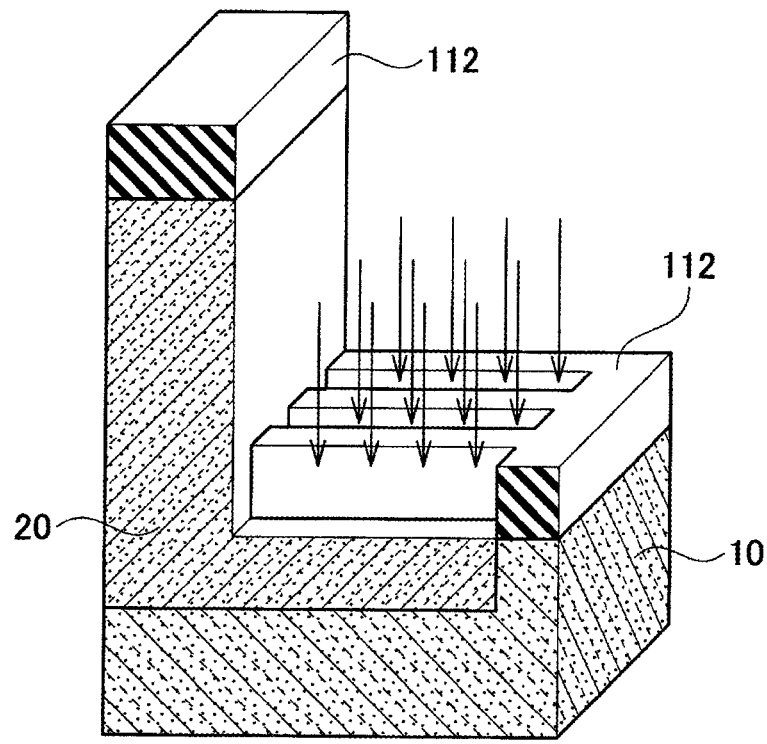
FIG. 7 is a perspective diagram for explaining the method of manufacturing the semiconductor device according to the first embodiment of the present invention (part 3).

Next, the n-type drift regions 21 are formed in the portion of the drift region 20 disposed at the bottom part 53 of the groove 100 (hereinafter referred to as the "bottom portion 54" of the drift region 20 with reference to FIGS. 1 and 2). For example, as illustrated in FIG. 7, a mask material 112 through which the regions of the bottom part 53 of the groove 100 to be the n-type drift regions 21 are exposed is formed by a photolithography technique. Then, the n-type drift regions 21 are formed selectively above the substrate 10 by ion-implanting impurities of the first conductivity type using the mask material 112 as a mask. At this time, the impurities are implanted a little obliquely toward the first sidewall 11 from the direction of the normal line to the main surface of the substrate 10, and thus, the impurities are implanted into portions below the sidewall portion 52 of the drift region 20. As a result, the sidewall portion 52 and bottom portion 54 of the drift region 20 are connected to each other. After that, the mask material 112 is removed.

Figure 8:
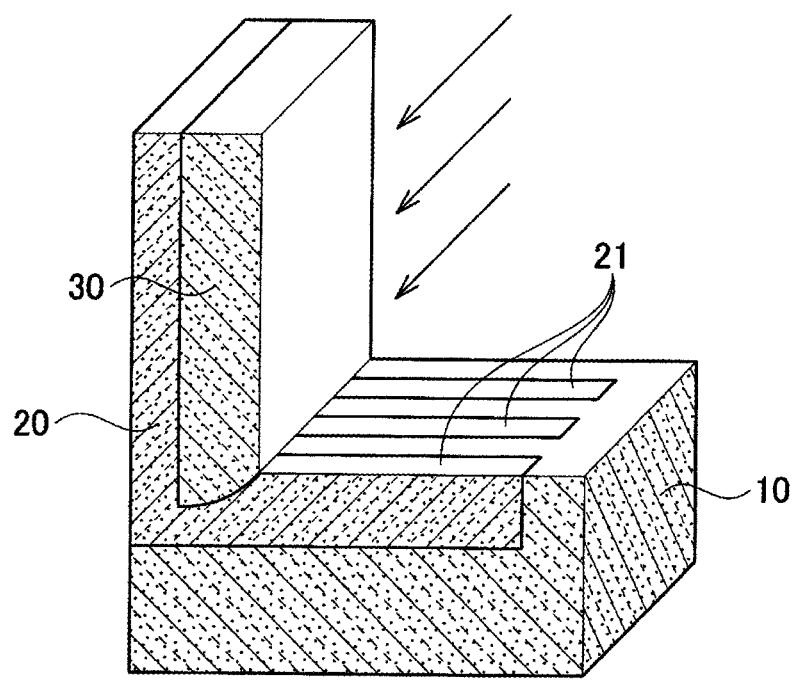
FIG. 8 is a perspective diagram for explaining the method of manufacturing the semiconductor device according to the first embodiment of the present invention (part 4).

Next a well region 30 is formed along the first sidewall 11 of the groove 100 to be connected to the drift region 20 by ion implantation or the like. For example, as arrows indicates in FIG. 8, the well region 30 is formed to cover the sidewall portion 52 of the drift region 20 by ion-implanting impurities of a second conductivity type obliquely from above the opening of the groove 100 along the first sidewall 11. At this time, the impurities can be implanted only along the first sidewall 11 of the groove 100 by setting the angle at which the impurities are implanted along the first sidewall 11 of the groove 100, according to the aspect ratio determined from the depth and the width in in the lateral direction of the groove 100. Through this process, the well region 30 is formed along the first sidewall 11 of the groove 100.

Since the impurities are implanted from obliquely above, the lower end of the well region 30 reaches below the bottom part of the groove 100. Note that the condition of the ion implantation is adjusted for the well region 30 not to pass through the drift region 20. The impurity concentration of the well region 30 is, for example, approximately $1E15/cm^3$ to $1E19/cm^3$.

Figure 9:
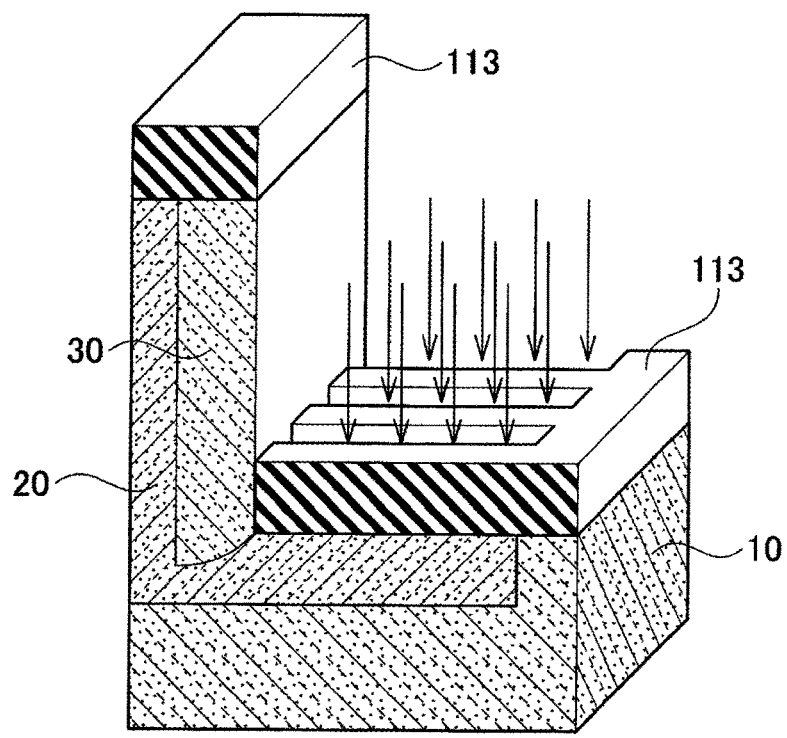
FIG. 9 is a perspective diagram for explaining the method of manufacturing the semiconductor device according to the first embodiment of the present invention (part 5).

Next, the p-type drift regions 22 are formed in the bottom portion of the drift region 20. For example, as illustrated in FIG. 9, a mask material 113 through which the regions of the bottom part of the groove 100 to be the p-type drift regions 22 are exposed is formed, and then, the p-type drift regions 22 are formed selectively above the substrate 10 by ion-implanting impurities of the second conductivity type using the mask material 113 used as a mask. Through this process, the bottom portion of the drift region 20 is formed in which the n-type drift region and the p-type drift region are disposed alternately along the longitudinal direction of the groove 100. After that, the mask material 113 is removed.

For the ion implantation in the processes up to this point, for example, nitrogen (N) is used for the n-type impurities of the first conductivity type, and aluminum (Al) or boron (B) is used for the p-type impurities of the second conductivity type. Note that ion implantation is performed in the state where the substrate 10 is heated to a temperature of approximately 600° C. to prevent or reduce the occurrence of crystal defects in the ion-implanted regions.

Meanwhile, in order to completely deplete the SJ structure in the off state to achieve a high breakdown voltage, the ratio of the total amount of p-type impurities in the p-type drift region and the total amount of n-type impurities in the n-type drift region needs to be set to around 1. Hence, a high breakdown voltage can be achieved when Nd representing the concentration of n-type impurities in the n-type drift region 21, Na representing the concentration of p-type impurities in the p-type drift region 22, Wn representing the width of the n-type drift region 21, and Wp representing the width of the p-type drift region 22 satisfy the following equation (1):

$$Na \times Wp = Nd \times Wn \qquad (1).$$

Width Wn and width Wp are the widths in the direction in which the n-type drift region 21 and the p-type drift region 22 are repeatedly arranged. The impurity concentrations of the n-type drift region 21 and the p-type drift region 22 are set to satisfy equation (1).

For a semiconductor device of an SJ structure having the drift region 20 that satisfies the above condition, the n-type drift regions 21 and the p-type drift regions 22 are depleted in the off state, which increases the breakdown voltage per unit area of the drift region 20. Note that the impurity concentration of the drift region 20 is, for example, approximately $1E15/cm^3$ to $1E19/cm^3$.

Figure 10:
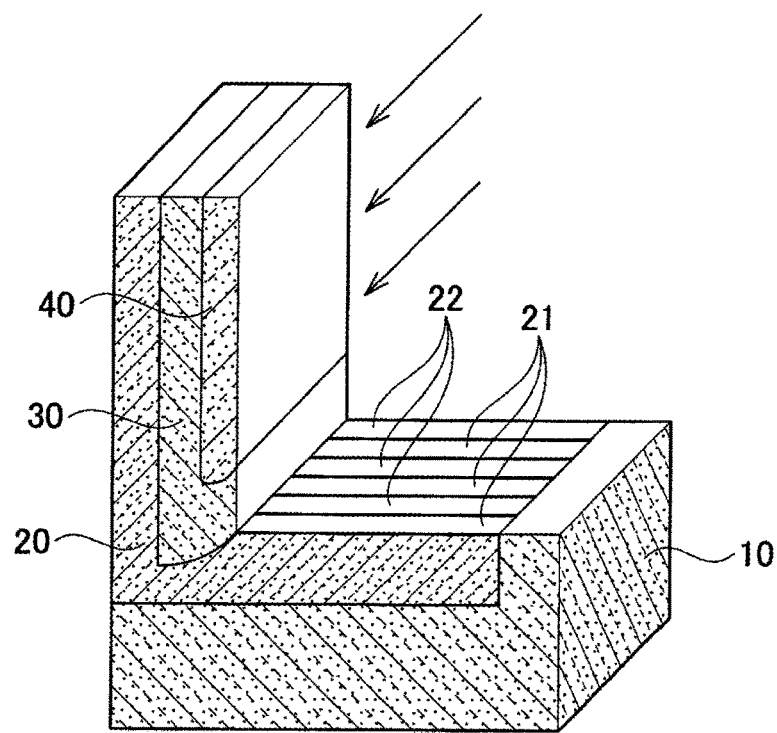
FIG. 10 is a perspective diagram for explaining the method of manufacturing the semiconductor device according to the first embodiment of the present invention (part 6).

Next, a source region 40 is formed on the surface of the well region 30 along the first sidewall 11 of the groove 100. For example, as the arrows indicate in FIG. 10, the source region 40 is formed in the region in which the well region 30 has been formed by ion-implanting impurities of the first conductivity type obliquely from above the opening of the groove 100 along the first sidewall 11. At this time, the impurities are implanted only into the well region 30 of the groove 100 by setting the angle at which the impurities are implanted into the first sidewall of the groove 100, according to the aspect ratio determined from the depth and the width in in the lateral direction of the groove 100. The impurity concentration of the source region 40 is, for example, approximately 1E18/cm3 to 1E21/cm3.

Note that the source region 40 is formed to be away from the drift region 20. Accordingly, the impurity implantation angle of ion implantation to form the source region 40 is set shallower than the impurity implantation angle of ion implantation to form the well region 30. From this setting, the lower end of the source region 40 is positioned above the lower end of the well region 30, which prevents the source region 40 from extending over to the outside of the well region 30.

Figure 11:
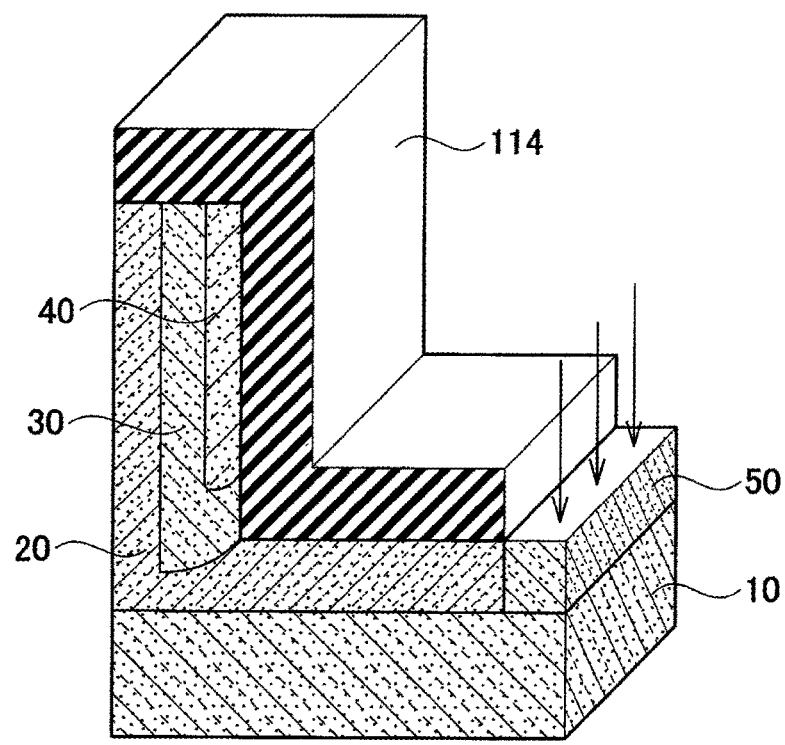
FIG. 11 is a perspective diagram for explaining the method of manufacturing the semiconductor device according to the first embodiment of the present invention (part 7).

Next, a drain region 50 is formed in the groove 100 to be opposed to the well region 30 via the drift region 20. The drain region 50 is connected to the drift region 20 at a position away from the well region 30. For example, the drain region 50 is formed selectively at the bottom part of the groove 100 by ion-implanting impurities of the first conductivity type using, as a mask, a mask material 114 formed such that a specified region is exposed through the mask material 114 as illustrated in FIG. 11. The impurity concentration of the drain region 50 is, for example, approximately $1E18/cm^3$ to $1E21/cm^3$.

After that, the ion-implanted impurities are activated by heat treatment. For example, heat treatment at around 1700° C. is performed in argon atmosphere or nitrogen atmosphere.

Figure 12:
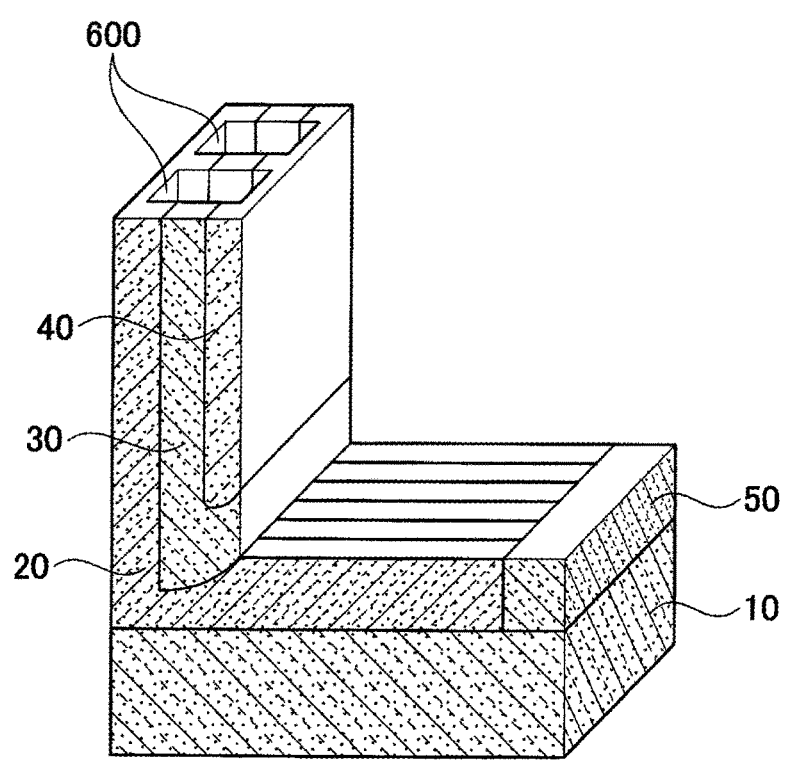
FIG. 12 is a perspective diagram for explaining the method of manufacturing the semiconductor device according to the first embodiment of the present invention (part 8).

Next as illustrated in FIG. 12, openings are formed to extend over the upper surfaces of the sidewall portion of the drift region 20, the well region 30, and the source region 40, and gate trenches 600 are formed to extend in the depth direction of the groove 100. For example, a mask material formed on the upper surface of the substrate 10 is patterned by a photolithography technique, and then, the gate trenches 600 are formed by etching. The gate trenches 600 are formed to have a width to reach the sidewall portion of the drift region 20, the well region 30, and the source region 40 and a depth to reach the drift region 20.

Next, gate insulating films 65 are formed on the inner wall surfaces of the gate trenches 600. For example, the inner wall surfaces of the gate trenches 600 are oxidized to form the gate insulating films 65. The method of forming the gate insulating films 65 may be a thermal oxidization method or a deposition method. As an example, in the case of a thermal oxidization method, the substrate 10 is heated to a temperature at around 1100° C. in oxygen atmosphere. After the gate insulating films 65 are formed, annealing at around 1000° C. may be performed in the atmosphere of nitrogen, argon, $N_2O$, or the like to decrease the interface state at the interface between the well region 30 and the gate insulating films 65. Alternatively, thermal oxidation in NO or $N_2O$ atmosphere may be performed directly. In that case, a temperature around 1100 to 1400° C. is preferable. The thickness of the gate insulating film 65 is approximately several tens nm.

Figure 13:
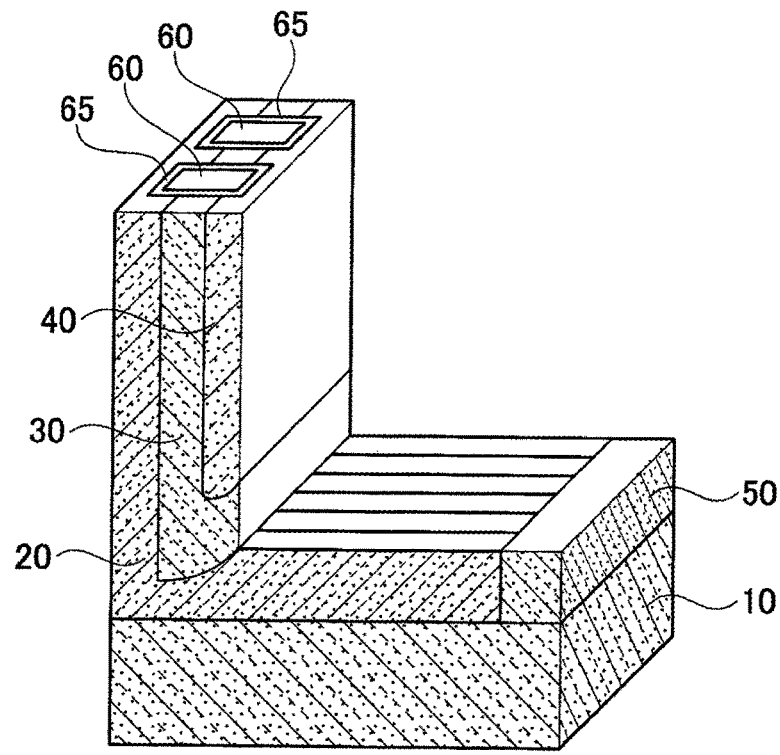
FIG. 13 is a perspective diagram for explaining the method of manufacturing the semiconductor device according to the first embodiment of the present invention (part 9).

Next, as illustrated in FIG. 13, the gate electrodes 60 are formed inside the gate trenches 600. The gate electrode 60 is opposed to the well region 30 via the gate insulating film 65. Because a typical material of the gate electrode 60 is polysilicon films, here description is made of the case of using polysilicon films for the gate electrodes 60.

The deposition method of the polysilicon films may be a low-pressure CVD method or the like. For example, the thickness of a deposited polysilicon film is set to a value larger than half the width in the longitudinal direction of the opening of the gate trench 600. Since a polysilicon film is formed from the inner wall surfaces of the gate trench 600, the gate trench 600 can be completely filled with a polysilicon film by setting the thickness of the polysilicon film as described above. For example, in the case where the width of the gate trench 600 is 2 μm, a polysilicon film is formed such that the film thickness is 1 μm or more. After the polysilicon film is deposited, an annealing treatment at 950° C. is performed in phosphorus oxychloride $POCl_3$ to form an n-type polysilicon film, which makes the gate electrode 60 conductive.

Next, the polysilicon film is planarized by etching. The etching method may be isotropic etching or anisotropic selective etching. The amount of etching is set such that the polysilicon film remains inside the gate trench 600. For example, in the case where the width of the gate trench 600 is 2 μm, and a polysilicon film has been deposited to a thickness of 1.5 μm, the amount of etching for the polysilicon film should preferably be set to 1.5 μm. However, for the amount of etching of 1.5 μm, several percent over-etching in the control of etching will not cause any problem.

Figure 14:
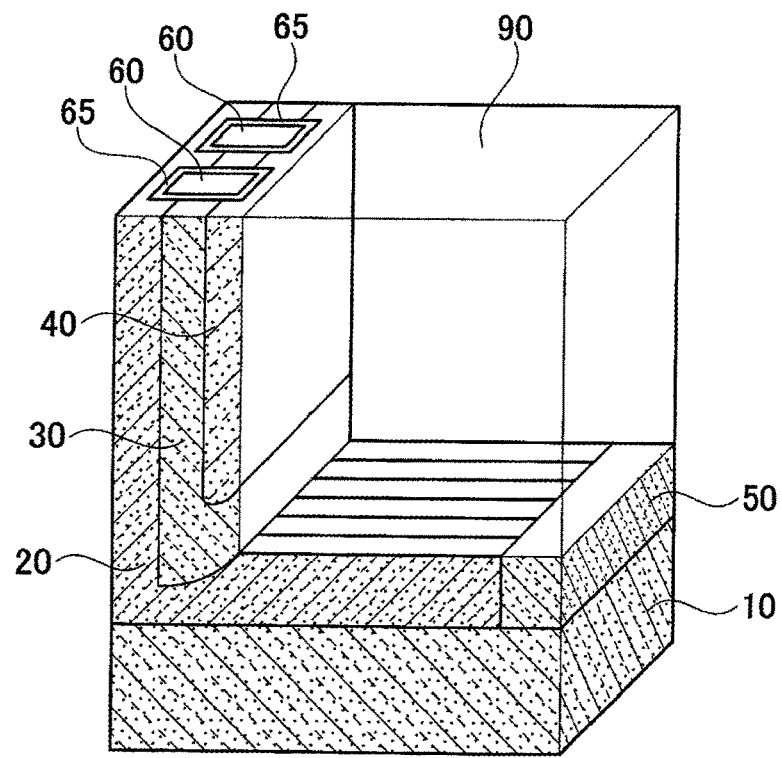
FIG. 14 is a perspective diagram for explaining the method of manufacturing the semiconductor device according to the first embodiment of the present invention (part 10).

After that, as illustrated in FIG. 14, an isolation insulating film 90 is deposited on the upper surface of the substrate 10, and the groove 100 is filled with the isolation insulating film 90. For the isolation insulating film 90, a silicon oxide film is typically preferable, and the deposition method may be a thermal CVD method or a plasma CVD method.

A resist film (not illustrated) formed on the upper surface of the isolation insulating film 90 is patterned by a photolithography technique or the like, and this resist film is used as a mask to selectively remove parts of the isolation insulating film 90 in the regions where a source electrode 70 and a drain electrode 80 are to be formed. Through the process of selectively removing the isolation insulating film 90, contact holes in which the contact surface of the source region 40 to be in contact with the source electrode 70 and the contact surface of the drain region 50 to be in contact with the drain electrode 80 are exposed are formed in the isolation insulating film 90. The etching method for forming the contact holes may be a wet etching method using hydrofluoric acid or a dry etching method such as reactive ion etching. After that, the resist film is removed using oxygen plasma, sulfuric acid, or the like.

Then, the source electrode 70 and the drain electrode 80 are formed as illustrated in FIG. 1 by filling the contact holes formed in the isolation insulating film 90. The source electrode 70 and the drain electrode 80 are typically metal films. The materials of the source electrode 70 and the drain electrode 80 may be metal materials such as nickel (Ni) and molybdenum (Mo). Alternatively, laminated layers made of titanium (Ti), nickel (Ni), silver (Ag), or the like may be used for the source electrode 70 and the drain electrode 80.

The source electrode 70 and the drain electrode 80 may be formed by depositing a metal material on the entire surface by a sputtering method, an electron beam (EB) vapor deposition method, or the like and then etching the metal material by a dry etching method using a patterned resist film as a mask. Alternatively, the source electrode 70 and the drain electrode 80 may be formed by filling the contact holes formed in the isolation insulating film 90 with a metal material by a plating process.

Through the processes above, the semiconductor device illustrated in FIG. 1 is completed. In the above, the drift region 20 is formed by ion-implanting impurities into the substrate 10 having an insulating property. This eliminates the need for a process of epitaxial growth and reduces the manufacturing cost.

Similarly, since the well region 30, the source region 40, and the drain region 50 are formed by ion-implantation impurities into the substrate 10, the manufacturing cost is lower than in the case of forming them by epitaxial growth.

In addition, the sidewall portion 52 of the drift region 20, the well region 30 formed along the surface of this sidewall portion 52, and the source region 40 formed in the surface of the well region 30 are formed by ion-implanting impurities obliquely from the opening of the groove 100 along the first sidewall 11. This process reduces the manufacturing cost and makes it possible to form these regions only along the first sidewall 11.

Figure 15:
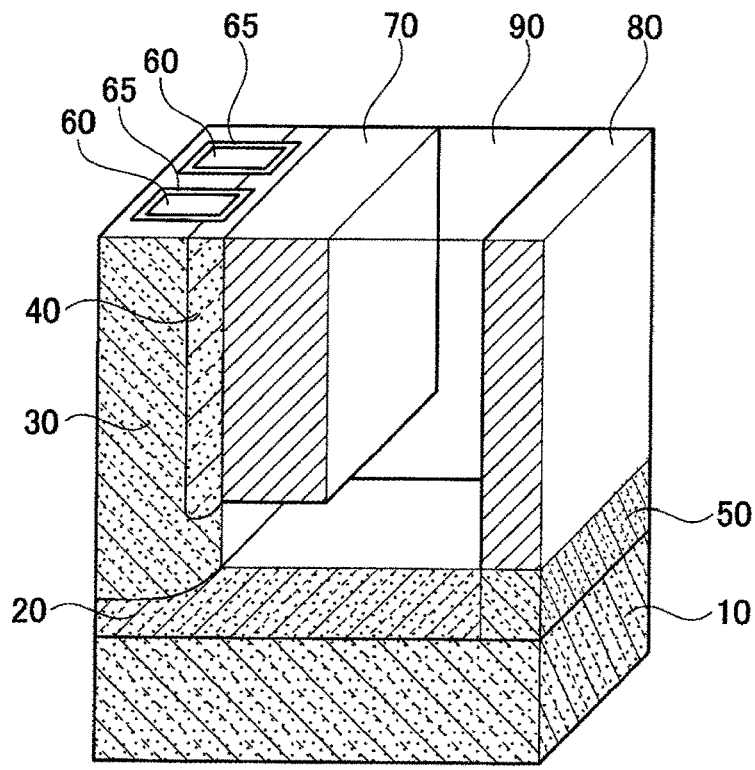
FIG. 15 is a schematic perspective diagram illustrating the configuration of a semiconductor device according to a modification of the first embodiment of the present invention.

<Modification> A semiconductor device according to a modification of the first embodiment, illustrated in FIG. 15 has a drift region 20 disposed only at the bottom part of a groove 100. In other words, the semiconductor device according to the modification is different from the semiconductor device illustrated in FIG. 1 in that the drift region 20 is not disposed along the first sidewall of the groove 100.

As illustrated in FIG. 15, the lower end of a well region 30 disposed along the first sidewall of the groove 100 is connected to the drift region 20 at the bottom part of the groove 100. The openings of gate trenches are formed to extend over the upper surfaces of the well region 30 and the first semiconductor region 40, and gate insulating films 65 and gate electrodes 60 are disposed inside the gate trenches. The gate trenches extend in the depth direction of the groove 100 and pass through the well region 30, and the lower ends of the gate trenches reach the drift region 20.

Since the semiconductor device illustrated in FIG. 15 does not have a drift region 20 along the first sidewall of the groove 100, the manufacturing process is shorter, and the manufacturing cost is lower.

Also in the semiconductor device illustrated in FIG. 15, the region immediately below the source electrode 70 is not a region that does not contribute to the operation of the transistor, which makes it possible to reduce the chip area. The channel regions are formed along the depth direction of the groove 100 in the on state, which reduces the on-resistance. Further, the source region 40 extends in the depth direction of the groove 100, which reduces the contact resistance between the source region 40 and the source electrode 70.

Note that the semiconductor device according to the embodiment of the present invention does not need to have a drift region 20 with a SJ structure, as illustrated in FIG. 15. In other words, the bottom portion of the drift region 20 may be formed to be a single layer.

Second Embodiment

Figure 16:
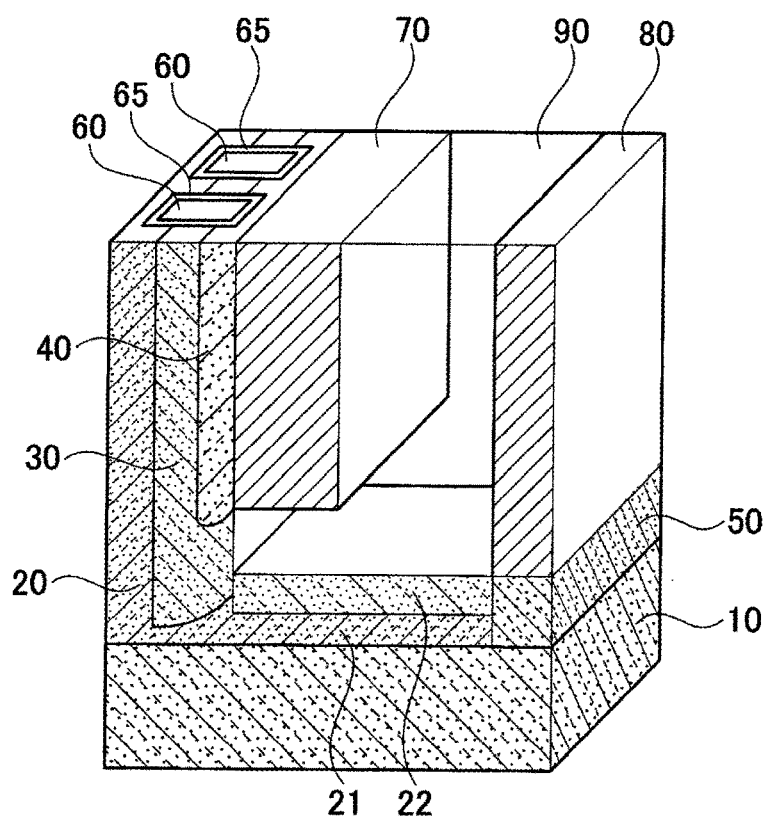
FIG. 16 is a schematic perspective diagram illustrating the configuration of a semiconductor device according to a second embodiment of the present invention.

In a semiconductor device according to a second embodiment of the present invention, a drift region 20 has, as illustrated in FIG. 16, a structure in which an n-type drift region 21 and a p-type drift region 22 are alternately layered along the depth direction of the groove 100 at the bottom part of the groove 100. Regarding the longitudinal direction of the groove 100, each of the n-type drift region 21 and the p-type drift region 22 is disposed to extend continuously over the entire surface, unlike the first embodiment having a structure in which an n-type drift region 21 and a p-type drift region 22 are alternately disposed. Other configurations are the same as those of the first embodiment illustrated in FIG. 1.

The semiconductor device illustrated in FIG. 16 operates in the same way as in the semiconductor device illustrated in FIG. 1. Specifically, when the voltage between the gate electrode 60 and the source electrode 70 is a specified threshold voltage or higher, the inversion layers are formed in the channel regions in the well region 30 at the side of the gate electrodes 60. This makes the semiconductor device in the on state. For the off operation, the voltage between the gate electrode 60 and the source electrode 70 is set to a specified threshold voltage or lower. This makes the inversion layers disappear, cutting off the main electrical current.

In the off state, a depletion layer spreads from the interface between the n-type drift region 21 and the p-type drift region 22 layered along the thickness direction of the groove 100. When the n-type drift region 21 and the p-type drift region 22 are in the pinch-off state, the electric field distribution of the n-type drift region 21 and the p-type drift region 22 becomes a uniform rectangle distribution, greatly decreasing the maximum electric field exerted on the semiconductor device. This improves the breakdown voltage of the semiconductor device.

Hereinafter, an example of a method of manufacturing the semiconductor device according to the second embodiment will be described with reference to the drawings.

In the same way as in the method described with reference to FIG. 5 in the first embodiment, a groove 100 is formed on a substrate 10. A substrate of a non-doped silicon carbide insulating semiconductor or the like is used for the substrate 10.

Figure 17:
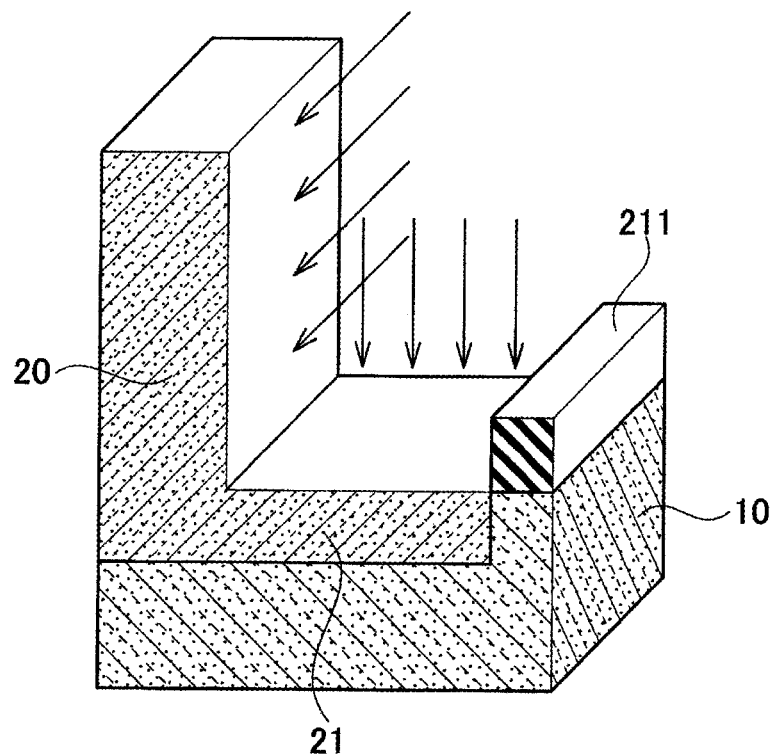
FIG. 17 is a perspective diagram for explaining a method of manufacturing the semiconductor device according to the second embodiment of the present invention (part 1).

Then, the sidewall portion 52 of a drift region 20 and an n-type drift region 21 are formed as illustrated in FIG. 17 by ion implantation using a mask material 211, which has been patterned using a photolithography technique or the like, as a mask. Specifically, the sidewall portion 52 of the drift region 20 is formed along the first sidewall 11 of the groove 100 by ion-implanting impurities from obliquely above into the first sidewall 11 of the groove 100. Then, the n-type drift region 21 is formed at the bottom part 53 of the groove 100 by ion-implanting impurities into the main surface of the substrate 10.

Figure 18:
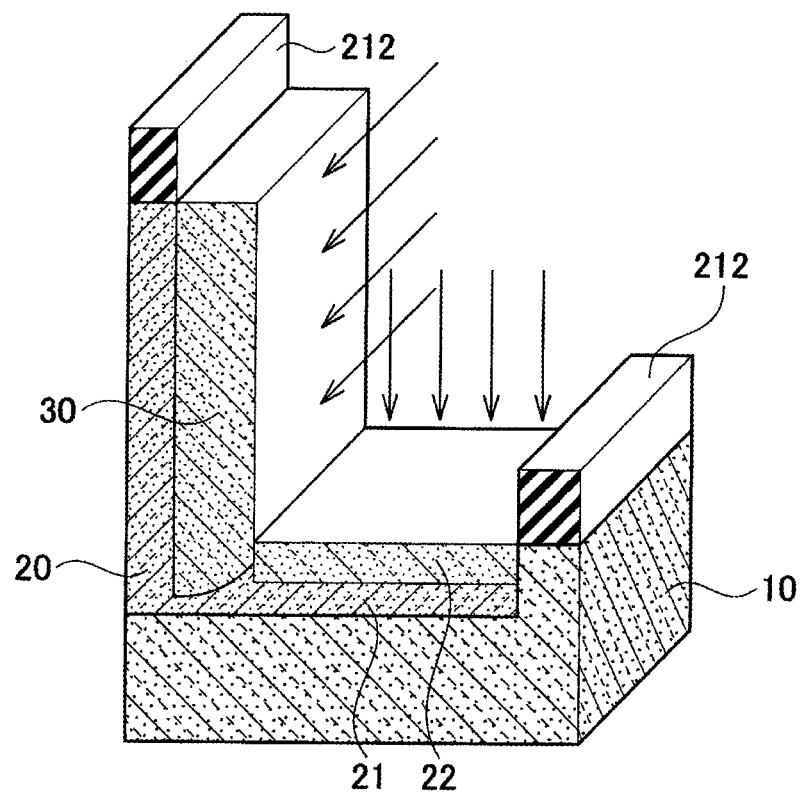
FIG. 18 is a perspective diagram for explaining the method of manufacturing the semiconductor device according to the second embodiment of the present invention (part 2).

After the mask material 211 is removed, the well region 30 and the p-type drift region 22 are formed by ion implantation using a newly formed mask material 212 as a mask as illustrated in FIG. 18. Specifically, the well region 30 is formed along the first sidewall 11 of the groove 100 to be layered with the sidewall portion 52 of the drift region 20 by ion-implanting impurities from obliquely above into the first sidewall 11 of the groove 100. Then, a p-type drift region 22 is formed at the bottom part 53 of the groove 100 to be layered with the n-type drift region 21 by ion-implanting impurities into the main surface of the substrate 10.

After that, a source region 40, drain region 50, gate insulating film 65, gate electrode 60, isolation insulating film 90, source electrode 70, and drain electrode 80 are formed in the same way as in the method described with reference to FIGS. 10 to 14 in the first embodiment. Through these processes, the semiconductor device illustrated in FIG. 16 is completed.

The semiconductor device according to the second embodiment may require only one mask material to form the sidewall portion of the drift region 20 and the n-type drift region 21 as described in the above manufacturing method. In addition, the semiconductor may require only one mask material to form the well region 30 and the p-type drift region 22. Thus, it is possible to reduce the manufacturing cost. In addition, as in the first embodiment, the region immediately below the source electrode 70 is not a region that does not contribute to the operation of the transistor, which makes it possible to reduce the chip area. The channel regions are formed along the depth direction of the groove 100 in the on state, which reduces the on-resistance. Further, the source region 40 extends in the depth direction of the groove 100, which reduces the contact resistance between the source region 40 and the source electrode 70.

Note that the n-type drift regions 21 and the p-type drift regions 22 may be alternately layered by repeating the process of forming the n-type drift region 21 and the process of forming the p-type drift region 22. These processes form a SJ structure having multiple pn junctions arranged at a constant cycle along the depth direction of the groove 100. This configuration further improves the breakdown voltage of the semiconductor device. Other features are substantially the same as those of the first embodiment, and thus repetitive description thereof is omitted.

Third Embodiment

Figure 19:
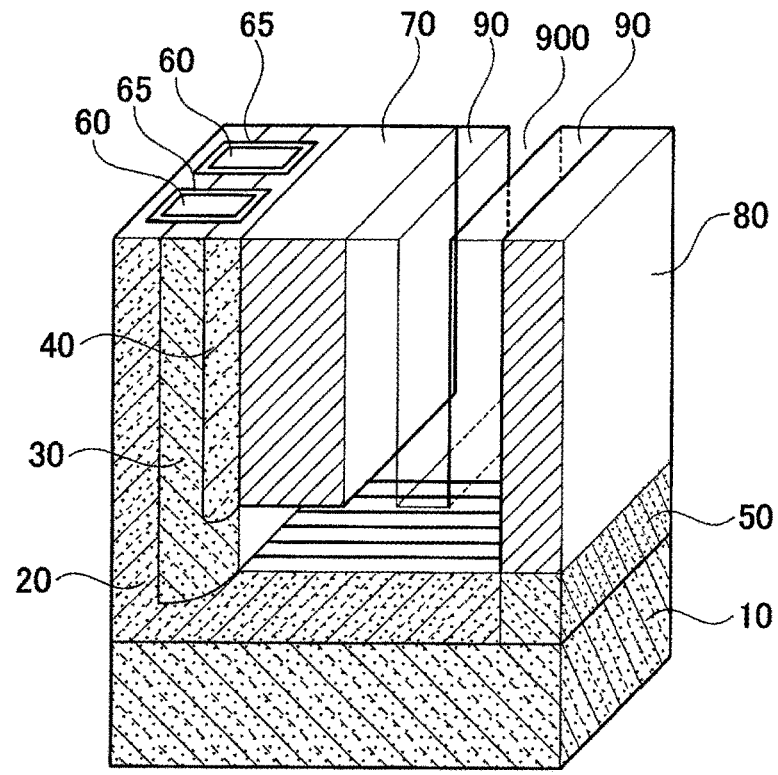
FIG. 19 is a schematic perspective diagram illustrating the configuration of a semiconductor device according to a third embodiment of the present invention.

A semiconductor device according to a third embodiment of the present invention, as illustrated in FIG. 19, has a dividing groove 900 that is formed in an isolation insulating film 90 disposed to fill the inside of the groove 100 between the source electrode 70 and the drain electrode 80 and that extends in parallel with the first sidewall of the groove 100. The dividing groove 900 divides a portion of the isolation insulating film 90 sandwiched between the source electrode 70 and the drain electrode 80. Specifically, the semiconductor device illustrated in FIG. 19 is different from the semiconductor device illustrated in FIG. 1 in that the dividing groove 900 divides the isolation insulating film 90 between the source electrode 70 and the drain electrode 80. Other configurations are the same as those of the first embodiment illustrated in FIG. 1.

For the semiconductor device illustrated in FIG. 19, the dividing groove 900 formed in the isolation insulating film 90, which is a space provided between the source electrode 70 and the drain electrode 80, reduces the parasitic capacitance (Cds) between the source electrode 70 and the drain electrode 80. This in turn reduces the switching loss caused by charging and discharging with the output capacitance (Coss) in switching operation of the semiconductor device.

To reduce the parasitic capacitance (Cds), the depth of the dividing groove 900 is set such that the dividing groove 900 is formed at least in the region via which the source electrode 70 and the drain electrode 80 face each other. For example, the dividing groove 900 is formed such that the bottom part of the dividing groove 900 is positioned to be lower than the lower end of the source electrode 70.

Note that even a small space formed in the isolation insulating film 90 between the source electrode 70 and the drain electrode 80 can reduce the parasitic capacitance (Cds). For example, a dividing groove 900 having a width of about several hundred nm to 1 μm is formed.

Figure 20:
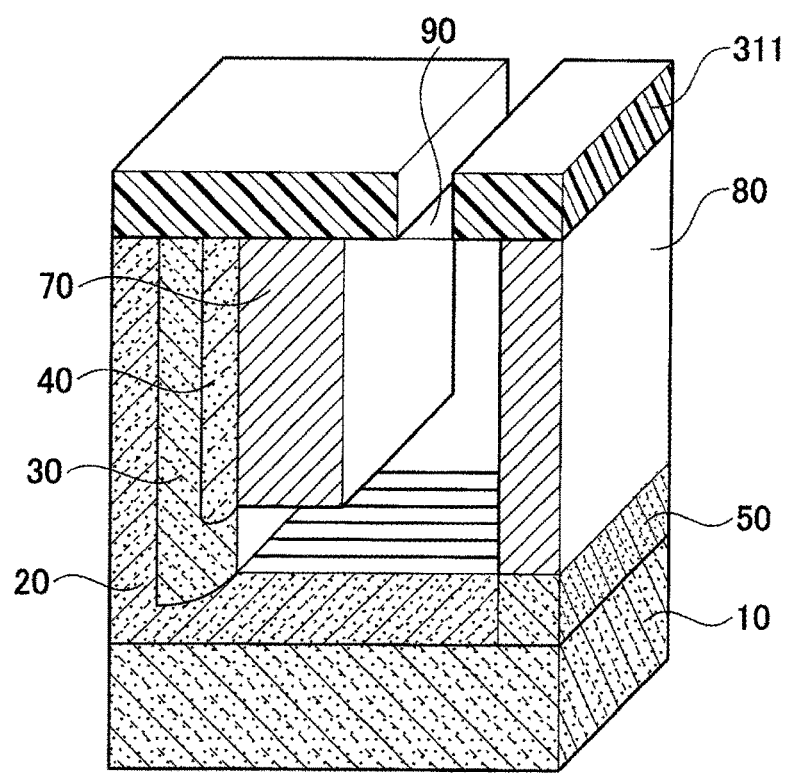
FIG. 20 is a perspective diagram for explaining a method of manufacturing the semiconductor device according to the third embodiment of the present invention.

The isolation insulating film 90 can be formed in the dividing groove 900 by a dry etching method or the like. For example, as illustrated in FIG. 20, after the isolation insulating film 90 is formed, a resist film 311 is formed on the upper surface of the isolation insulating film 90 and patterned by a photolithography technique to remove part of the resist film 311 in the region where the dividing groove 900 is to be formed. Then, the isolation insulating film 90 is selectively etched by a dry etching method using the resist film 311 as a mask to form the dividing groove 900. Other features are substantially the same as those of the first embodiment, and thus repetitive description thereof is omitted.

Fourth Embodiment

Figure 21:
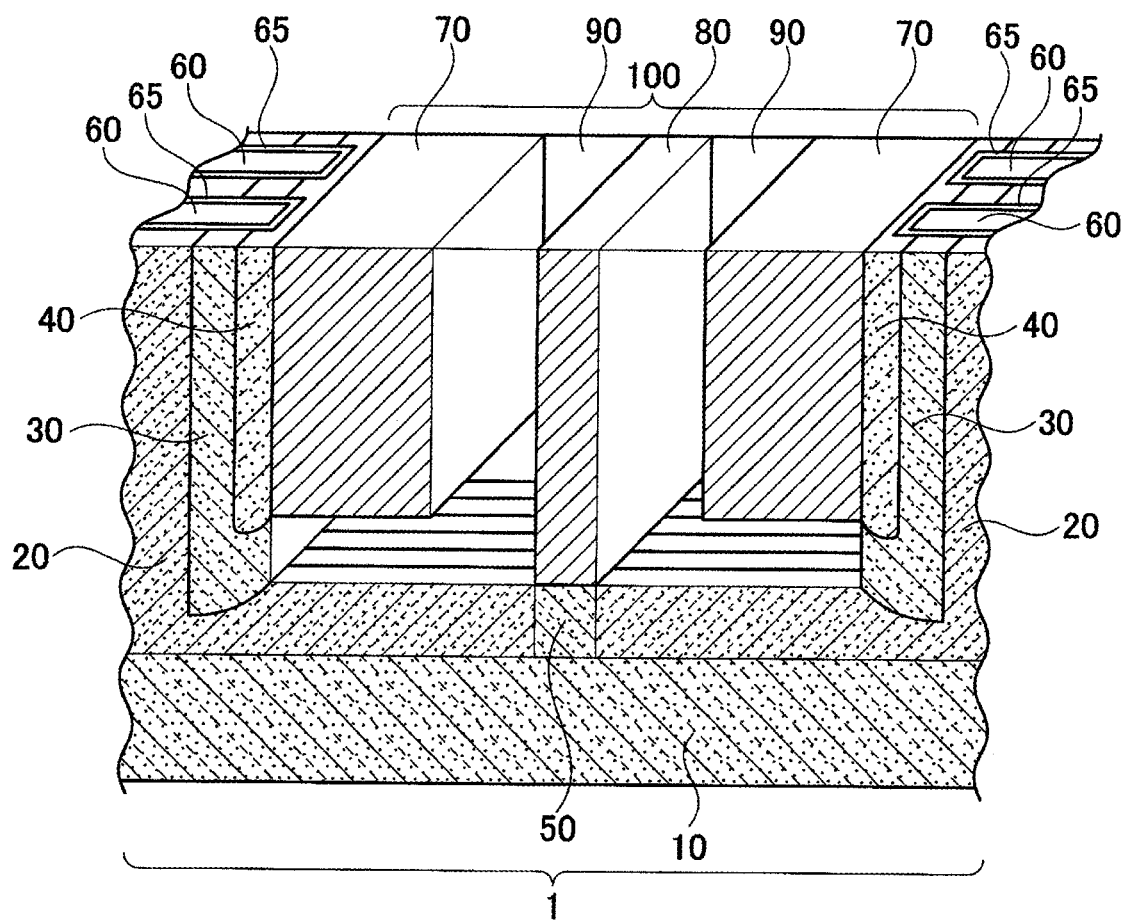
FIG. 21 is a schematic perspective diagram illustrating the configuration of a semiconductor device according to a fourth embodiment of the present invention.

A semiconductor device according to a fourth embodiment of the present invention, as illustrated in FIG. 21, has two semiconductor devices in one groove 100 each having the same configuration as in the semiconductor device according to the first to the third embodiments.

Specifically, a drain region 50 is disposed between a first sidewall 11 and a second sidewall opposed to each other and at the bottom part 53 in the center of the groove 100, and a drain electrode 80 is disposed on the upper surface of the drain region 50. Then, two semiconductor devices having respective source regions 40 disposed along the first sidewall 11 and second sidewall 24 of the groove 100 are integrated.

The semiconductor devices illustrated in FIG. 21 has a unit structure 1 including two semiconductor devices that share the drain region 50 and the drain electrode 80. The unit structure 1, in which two semiconductor devices are disposed for one groove 100 along the lateral direction of the groove 100, improves the integration density.

Note that although FIG. 21 illustrates only one unit structure 1, multiple unit structures 1 may be connected along the lateral direction of the groove 100, sharing the gate electrodes 60 of each unit structure 1. Other features are substantially the same as those of the first to third embodiments, and thus repetitive description thereof is omitted.

Other Embodiments

Although the present invention has been described by showing embodiments as above, it should not be understood that the descriptions and drawings consisting part of this disclosure limit this invention. From this disclosure, various alternative embodiments, examples, and operational techniques will be apparent to those skilled in the art.

For example, although an example in which a SiC substrate is used for the substrate 10 has been described in the above, the material of the substrate 10 is not limited to a SiC substrate, but a substrate 10 made of a semiconductor material having a wide band gap may be used. Examples of semiconductor materials having a wide band gap include GaN, diamond, ZnO, and AlGaN.

In addition, although an example in which an n-type polysilicon film is used for the gate electrode 60 has been described, a p-type polysilicon film may be used for it. In addition, other semiconductor materials may be used for the gate electrode 60, or other conductive materials such as a metal material may be used. For example, poly-silicon carbide, SiGe, Al, or the like of the second conductivity type may be used for the material of the gate electrode 60.

Note that an example in which a silicon oxide film is used for the gate insulating film 65 has been described, a silicon nitride film may be used for the gate insulating film 65. Alternatively, layered material of a silicon oxide film and a silicon nitride film may be used for the gate insulating film 65. Isotropic etching for the case where a silicon nitride film is used for the gate insulating film 65 can be performed by cleaning with hot phosphoric acid at 160° C.

In addition, although the above description is based on the assumption that the first semiconductor region 40 is the source region and that the second semiconductor region 50 is the drain region, the semiconductor device may be configured such that the first semiconductor region 40 is the drain region and that the second semiconductor region 50 is the source region.

As above, it goes without saying that the present invention includes various embodiments and the like not described herein.

INDUSTRIAL APPLICABILITY

The semiconductor device and method of manufacturing the same according to the present invention can be used in the electronics industry including a manufacturing industry that manufactures semiconductor devices in which the main electrical current flowing between two main electrodes is controlled.

REFERENCE SIGNS LIST

10 substrate
20 drift region
21 n-type drift region
22 p-type drift region
30 well region
40 first semiconductor region
50 second semiconductor region
60 gate electrode
65 gate insulating film
70 first main electrode
80 second main electrode
90 isolation insulating film

The invention claimed is:

1. A semiconductor device comprising:
   a substrate having a groove formed on a main surface of the substrate;
   a drift region of a first conductivity type, the drift region being disposed from a first sidewall of the groove to a bottom part of the groove;
   a well region of a second conductivity type, the well region being disposed along the first sidewall of the groove to be connected to the drift region and being connected to the drift region at the bottom part of the groove;
   a first semiconductor region of the first conductivity type, the first semiconductor region being disposed on a surface of the well region along the first sidewall of the groove to be away from the drift region;
   a second semiconductor region of the first conductivity type, the second semiconductor region being disposed at the bottom part of the groove to adjoin to the drift region to be adjacent to a second sidewall of the groove, and in proximity to the second sidewall to be opposed to and in parallel to the first sidewall of the groove; and
   a gate electrode opposed to the well region, the gate electrode being disposed in a gate trench that has an opening extending over the upper surfaces of the well region and the first semiconductor region and extends in a depth direction of the groove,
   wherein the drift region has a sidewall portion formed along the first sidewall of the groove from an opening of the groove and a bottom portion disposed at the bottom part of the groove, a lower end of the sidewall portion reaches below the bottom part of the groove, and the sidewall portion and the bottom portion are connected to each other.

2. The semiconductor device according to claim 1, wherein
   the well region is disposed on a surface of the drift region along the first sidewall of the groove.

3. The semiconductor device according to claim 1, wherein
   the substrate is an insulating substrate.

4. The semiconductor device according to claim 1, wherein
   at least a portion of the drift region has a structure in which a first conductivity type region and a second conductivity type region are disposed alternately along a longitudinal direction of the groove in which the first sidewall extends.

5. The semiconductor device according to claim 1, wherein
   at least the portion of the drift region disposed at the bottom part of the groove has a structure in which a first conductivity type region and a second conductivity type region are layered along the depth direction of the groove.

6. The semiconductor device according to claim 4, wherein
   impurity concentrations of the first conductivity type region and the second conductivity type region are set such that the first conductivity type region and the second conductivity type region are depleted by a depletion layer that spreads from a pn junction formed at the boundary between the first conductivity type region and the second conductivity type region, in an off state in which main electrical current flowing between the first semiconductor region and the second semiconductor region is cut off.

7. The semiconductor device according to claim 5, wherein
   impurity concentrations of the first conductivity type region and the second conductivity type region are set such that the first conductivity type region and the second conductivity type region are depleted by a depletion layer that spreads from a pn junction formed at the boundary between the first conductivity type region and the second conductivity type region, in an off state in which main electrical current flowing between the first semiconductor region and the second semiconductor region is cut off.

8. The semiconductor device according to claim 1, further comprising:
   a first main electrode disposed on a surface of the first semiconductor region along the first sidewall of the groove and electrically connected to the first semiconductor region;

a second main electrode disposed in the groove to be opposed to the first main electrode and electrically connected to the second semiconductor region; and an isolation insulating film disposed between the first main electrode and the second main electrode and filling the inside of the groove, wherein a portion of the isolation insulating film, the portion sandwiched between the first main electrode and the second main electrode, is divided by a dividing groove extending in parallel with the first sidewall of the groove.

9. The semiconductor device according to claim 1, wherein the first semiconductor region extends in the depth direction of the groove from the opening of the groove.

10. A semiconductor device comprising:

a substrate having a groove formed on a main surface of the substrate;

a drift region of a first conductivity type, the drift region being disposed from a first sidewall of the groove to a bottom part of the groove;

a well region of a second conductivity type, the well region being disposed along the first sidewall of the groove to be connected to the drift region;

a first semiconductor region of the first conductivity type, the first semiconductor region being disposed on a surface of the well region along the first sidewall of the groove;

a second semiconductor region of the first conductivity type, the second semiconductor region being disposed at the bottom part of the groove to adjoin to the drift region to be adjacent to a second sidewall of the groove, and in proximity to the second sidewall to be opposed to the first sidewall of the groove; and a gate electrode opposed to the well region, the gate electrode being disposed in a gate trench that has an opening extending over the upper surfaces of the well region and the first semiconductor region and extends in a depth direction of the groove, wherein the well region is formed from the opening of the groove along the first sidewall of the groove, and wherein the drift region has a sidewall portion formed along the first sidewall of the groove from an opening of the groove and a bottom portion disposed at the bottom part of the groove, and a lower end of the well region reaches below the bottom part of the groove.

* * * * *